United States Patent
Färm et al.

(10) Patent No.: US 12,406,881 B2
(45) Date of Patent: Sep. 2, 2025

(54) METHODS AND SYSTEMS FOR FILLING A GAP

(71) Applicant: ASM IP Holding B.V., Almere (NL)

(72) Inventors: Elina Färm, Helsinki (FI); Shinya Iwashita, Helsinki (FI); Charles Dezelah, Helsinki (FI); Jan Willem Maes, Wilrijk (BE); Timothee Blanquart, Oud-Heverlee (BE); René Henricus Jozef Vervuurt, Leuven (BE); Viljami Pore, Helsinki (FI); Giuseppe Alessio Verni, Jodoigne (BE); Qi Xie, Wilsele (BE); Ren-Jie Chang, Leuven (BE); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 520 days.

(21) Appl. No.: 17/680,711

(22) Filed: Feb. 25, 2022

(65) Prior Publication Data

US 2022/0285211 A1   Sep. 8, 2022

Related U.S. Application Data

(60) Provisional application No. 63/250,885, filed on Sep. 30, 2021, provisional application No. 63/155,382, filed on Mar. 2, 2021, provisional application No. 63/155,388, filed on Mar. 2, 2021.

(51) Int. Cl.
*H01L 21/768* (2006.01)
*C23C 16/455* (2006.01)
*H01L 21/02* (2006.01)

(52) U.S. Cl.
CPC .. *H01L 21/76837* (2013.01); *C23C 16/45553* (2013.01); *H01L 21/0228* (2013.01)

(58) Field of Classification Search
CPC ............ C23C 16/06–08; C23C 16/045; C23C 16/45536; H01L 21/76837
See application file for complete search history.

(56) References Cited

U.S. PATENT DOCUMENTS

| | | | |
|---|---|---|---|
| 4,300,149 A | 11/1981 | Howard et al. |
| 4,621,277 A | 11/1986 | Ito et al. |
| 6,319,766 B1 | 11/2001 | Bakli et al. |

(Continued)

FOREIGN PATENT DOCUMENTS

| | | |
|---|---|---|
| CN | 102127372 A | 7/2011 |
| JP | 2005187943 A | 7/2005 |

(Continued)

OTHER PUBLICATIONS

Galesic et al.; Formation of vanadium nitride by rapid thermal processing; Thin Solid Films 349 (1999): 14-18.

(Continued)

*Primary Examiner* — Jose R Diaz
(74) *Attorney, Agent, or Firm* — Snell & Wilmer L.L.P.

(57) ABSTRACT

Disclosed are methods and systems for filling a gap. An exemplary method comprises providing a substrate to a reaction chamber. The substrate comprises the gap. The method further comprises at least partially filling the gap with a gap filling fluid. The methods and systems are useful, for example, in the field of integrated circuit manufacture.

17 Claims, 10 Drawing Sheets

(56) References Cited

U.S. PATENT DOCUMENTS

| | | |
|---|---|---|
| 6,623,799 B1 | 9/2003 | Lee et al. |
| 6,720,262 B2 | 4/2004 | Koh et al. |
| 6,759,081 B2 | 7/2004 | Huganen |
| 7,622,369 B1 | 11/2009 | Lee |
| 7,651,959 B2 | 1/2010 | Fukazawa |
| 8,557,712 B1 | 10/2013 | Antonelli et al. |
| 9,029,272 B1 | 5/2015 | Nakano |
| 9,685,371 B2 | 6/2017 | Zope et al. |
| 9,812,320 B1 | 11/2017 | Pore |
| 9,887,082 B1 | 2/2018 | Pore |
| 10,094,035 B1 | 10/2018 | Graham |
| 10,177,025 B2 | 1/2019 | Pore |
| 10,388,513 B1 | 8/2019 | Blanquart |
| 10,395,919 B2 | 8/2019 | Masaru |
| 10,460,932 B2 | 10/2019 | Van Aerde |
| 10,580,645 B2 | 3/2020 | Ueda |
| 11,295,980 B2 | 4/2022 | Zope |
| 11,447,864 B2 | 9/2022 | Fluit |
| 11,501,968 B2 | 11/2022 | Pierreux |
| 11,527,403 B2 | 12/2022 | Salmi |
| 12,112,942 B2 | 10/2024 | Ko |
| 2002/0060363 A1 | 5/2002 | Xi et al. |
| 2004/0224504 A1 | 11/2004 | Gadgil |
| 2005/0260357 A1 | 11/2005 | Olsen et al. |
| 2009/0011145 A1 | 1/2009 | Yun |
| 2009/0317982 A1 | 12/2009 | Li et al. |
| 2014/0124361 A1 | 5/2014 | Reid |
| 2015/0160149 A1 | 6/2015 | Bae et al. |
| 2016/0307905 A1 | 10/2016 | Lansalot-Matras et al. |
| 2017/0140983 A1 | 5/2017 | Leschkies et al. |
| 2017/0309476 A1 | 10/2017 | Venkatasubramanian |
| 2017/0350012 A1 | 12/2017 | Moon et al. |
| 2018/0261502 A1 | 9/2018 | Tan |
| 2019/0351595 A1 | 11/2019 | Moreels |
| 2019/0371662 A1 | 12/2019 | Chen et al. |
| 2020/0052089 A1 | 2/2020 | Yu |
| 2020/0194304 A1 | 6/2020 | Roy et al. |
| 2020/0365447 A1 | 11/2020 | Mays et al. |
| 2020/0381275 A1 | 12/2020 | Brezoczky |
| 2021/0066080 A1 | 3/2021 | Mattinen et al. |
| 2021/0125832 A1 | 4/2021 | Bhatnagar |
| 2021/0143003 A1 | 5/2021 | Fukuda |
| 2021/0249303 A1 | 8/2021 | Blanquart |
| 2021/0257213 A1 | 8/2021 | Kikuchi |
| 2021/0285102 A1* | 9/2021 | Yoon ................ H01L 23/53252 |
| 2021/0313150 A1 | 10/2021 | Kang |
| 2021/0327714 A1 | 10/2021 | Lee |
| 2021/0332479 A1 | 10/2021 | Kim |
| 2022/0005693 A1 | 1/2022 | Mizoguchi |
| 2022/0051935 A1 | 2/2022 | Kim |
| 2022/0076996 A1 | 3/2022 | Blanquart |
| 2022/0081769 A1 | 3/2022 | Chaney |
| 2022/0102190 A1 | 3/2022 | Kang |
| 2022/0108915 A1 | 4/2022 | Liu |
| 2022/0119944 A1 | 4/2022 | Yoshimoto |
| 2022/0122841 A1 | 4/2022 | Blanquart |
| 2022/0165569 A1 | 5/2022 | Liu |
| 2022/0165615 A1 | 5/2022 | Liu |
| 2022/0223411 A1 | 7/2022 | Blanquart |
| 2022/0282374 A1 | 9/2022 | Alessio Verni |
| 2022/0285146 A1 | 9/2022 | Alessio Verni |
| 2022/0293463 A1 | 9/2022 | Vervuurt |
| 2022/0301823 A1 | 9/2022 | Yoo |
| 2022/0319834 A1 | 10/2022 | Vervuurt |
| 2022/0319855 A1 | 10/2022 | Blanquart |
| 2022/0415650 A1 | 12/2022 | Ko |
| 2023/0030566 A1 | 2/2023 | Yoo |
| 2023/0069459 A1 | 3/2023 | Haukka |
| 2023/0095086 A1 | 3/2023 | Blanquart |
| 2023/0096453 A1 | 3/2023 | Lee |
| 2023/0096838 A1* | 3/2023 | Maes ................ H01L 21/02318 438/778 |
| 2023/0098575 A1* | 3/2023 | Dezelah ............ H01L 21/28562 427/253 |
| 2023/0110980 A1 | 4/2023 | La |
| 2023/0357924 A1 | 11/2023 | Shero |

FOREIGN PATENT DOCUMENTS

| | | |
|---|---|---|
| KR | 20070023477 A | 2/2007 |
| WO | 2019142055 A2 | 7/2019 |

OTHER PUBLICATIONS

Lee et al.; Growth without Postannealing of Monoclinic VO2 Thin Film by Atomic Layer Deposition Using VCI4 as Precursor; Coatings 2018, 8, 431; 11pp.

Choi et al.; Superfilling CVD of Copper Using A Catalytic Surfactant; IEEE; 2001; 3pp.

Merdrignac-Conanec et al.; Nitridation under ammonia of high surface area vanadium aerogels; Journal of Solid State Chemistry 178 (2005): 218-223.

Oyama et al.; Topotactic synthesis of vanadium nitride solid foams; Journal of materials research 8.6 (1993): 1450-1454.

Niskanen et al.; Radical-Enhanced Atomic Layer Deposition of Metallic Copper Thin Films; Journal of The Electrochemical Society, 152 (1) G25-G28 (2005).

Povey, et al., Atomic layer deposition for the fabrication of 3D photonic crystals structures: Growth of Al2O3 and VO2 photonic crystal systems, Surface & Coating Tech 201(2007) 9345-9348.

Ostreng, et al., Optical Properties of Vanadium Pentoxide Deposited by ALD, The Journal of Phys. Chem., 116 (2012) 19444-19450.

Lee et al., Growth without Postannealing of Monoclinic VO2 Thin Film by Atomic Layer Deposition Using VCI4 as Precursor, Coatings Nov. 27, 2018, 8(2018) 431, 1-11.

Blanquart et al., Atomic layer deposition and characterization of vanadium oxide thin films, RSC Advances 3 (2013) 1179-1185.

Transition metal. Referenced from Encyclopaedia Britannica (Year: 1998); https://www.britannica.com/science/transition-metal; 11pp.

Group VIA-Chalcogens. Referenced from ChemPrime LibreTexts; https://chem.libretexts.org.@go/page/49509 (year: 2025); 2pp.

Halogen. References from Encyclopaedia Britannica (Year: 1998); https://www.britannica.com/science/halogen; 10pp.

* cited by examiner

METHODS AND SYSTEMS FOR FILLING A GAP

CROSS-REFERENCE TO RELATED APPLICATIONS

This application claims priority to U.S. Provisional Patent Application Ser. No. 63/155,382 filed Mar. 2, 2021 titled METHODS AND SYSTEMS FOR FORMING A LAYER COMPRISING VANADIUM AND OXYGEN; U.S. Provisional Patent Application Ser. No. 63/155,388 filed Mar. 2, 2021 titled METHODS AND SYSTEMS FOR FORMING A LAYER COMPRISING VANADIUM AND NITROGEN; and U.S. Provisional Patent Application Ser. No. 63/250,885 filed Sep. 30, 2021 titled METHODS AND SYSTEMS FOR FILLING A GAP, the disclosures of which are hereby incorporated by reference in their entirety.

FIELD OF INVENTION

The present disclosure generally relates to the field of semiconductor processing methods and systems, and to the field integrated circuit manufacture. In particular, methods and systems suitable for filling a gap are disclosed.

BACKGROUND OF THE DISCLOSURE

The scaling of semiconductor devices, such as, for example, logic devices and memory devices, has led to significant improvements in speed and density of integrated circuits. However, conventional device scaling techniques face significant challenges for future technology nodes.

For example, one challenge has been finding suitable ways of filling gaps such as recesses, trenches, vias and the like with a material without formation of any gaps or voids.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of filling a gap, to structures and devices formed using such methods, and to apparatus for performing the methods and/or for forming the structures and/or devices. Materials formed by means of a method as described herein may be used in a variety of applications. For example, they may be used in the field of integrated circuit manufacture.

Thus described herein is a method of filling a gap. The method comprises providing a substrate to a reaction chamber. The substrate comprises the gap. The method further comprises exposing the substrate to a precursor and to a reactant. At least one of the precursor and the reactant comprises a metal or a metalloid, and at least one of the precursor and the reactant comprises a halogen. Accordingly, the precursor and the reactant are allowed to form a gap filling fluid. Also, the gap is at least partially filled with the gap filling fluid. It shall be understood that the gap filling fluid comprises the metal or the metalloid.

Further described herein is a system. The system comprises a reaction chamber and a precursor gas source. The precursor gas source comprises a metal precursor. The system further comprises a deposition reactant gas source. The deposition reactant gas source comprises a deposition reactant. The system further comprises a controller. The controller is configured to control gas flow into the reaction chamber to form a layer on a substrate by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWINGS

A more complete understanding of the embodiments of the present disclosure may be derived by referring to the detailed description and claims when considered in connection with the following illustrative figures.

Figure 1:
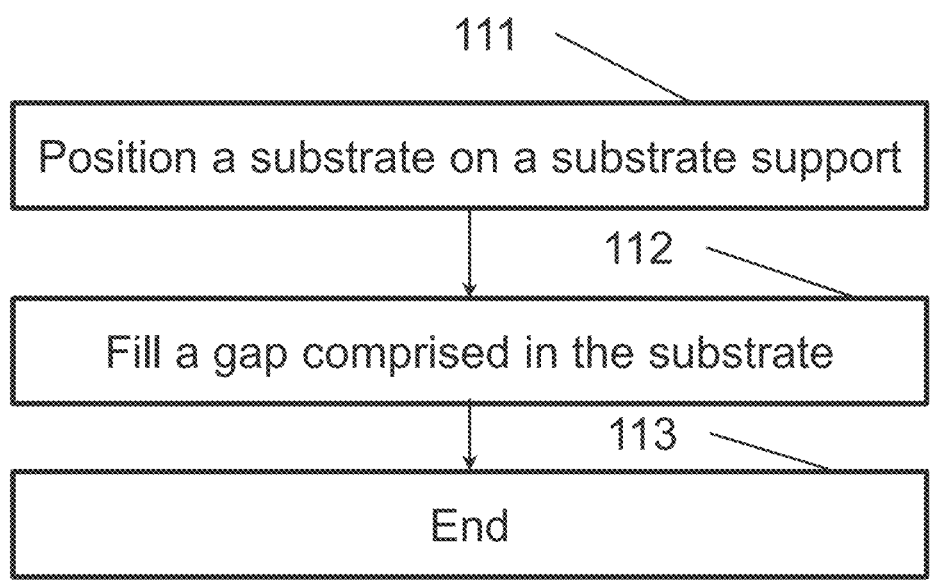
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include at least one of bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or can include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes".

As used herein, the term "gap filling fluid", also referred to as "flowable gap fill", may refer to a composition of matter that is liquid, or that can form a liquid, under the conditions under which is formed and which has the capability to form a solid material in a gap. A "gap filling fluid" can, in some embodiments, be only temporarily in a flowable state, for example when the "gap filling fluid" is temporarily formed through formation of liquid oligomers from gaseous monomers during a polymerization reaction, and the liquid oligomers continue to polymerize to form a solid polymeric material; or when the gap filling fluid solidifies after cooling down; or when the gap filling fluid forms a solid material as it undergoes a chemical reaction. For ease of reference, a solid material formed from a gap filling fluid may, in some embodiments, be simply referred to as "gap filling fluid".

A method as described herein can comprise depositing a layer by means of a cyclic deposition process. The term "cyclic deposition process" or "cyclical deposition process" can refer to a sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a CVD component.

A method as described herein can comprise depositing a layer by means of an atomic layer deposition process. The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element that may be incorporated during a deposition process as described herein.

The term "oxygen reactant" can refer to a gas or a material that can become gaseous and that can be represented by a chemical formula that includes oxygen. In some cases, the chemical formula includes oxygen and hydrogen.

The term "nitrogen reactant" can refer to a gas or a material that can become gaseous and that can be represented by a chemical formula that includes nitrogen. In some cases, the chemical formula includes nitrogen and hydrogen.

Further, in this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, or the like.

Further, it shall be understood that the term "comprising", when referring to certain features, indicates those features are included, but that the presence of other features is not excluded, as long as they do not render the corresponding embodiment unworkable. It shall be understood that the meaning of the term "comprising" includes the meaning of the term "consisting". The term "consisting" indicates that no further features are present in the corresponding embodiment apart from the ones following said wording. The term "comprising" includes the meaning of the term "substantially consisting". The term "substantially consisting" indicates that no further features are present in the corresponding embodiments apart from the ones following said wording, except when those further features do not have any material effect on the properties or function of the corresponding embodiment.

It shall be understood that a distal portion of a gap refers to a portion of the gap feature that is relatively far removed from a substrate's surface, and that the proximal portion of a gap feature refers to a part of the gap feature that is closer to the substrate's surface compared to the lower/deeper portion of the gap feature.

In this disclosure, any defined meanings do not necessarily exclude ordinary and customary meanings, in some embodiments.

Described herein is a method of filling a gap. The method comprises providing a substrate to a reaction chamber. A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

It shall be understood that the substrate comprises the gap. The substrate is exposed to a precursor and to a reactant. At least one of the precursor and the reactant comprise a metal or a metalloid. In some embodiments, at least one of the precursor and the reactant comprises a metal. In some embodiments, at least one of the precursor and the reactant comprises a metalloid. In addition, at least one of the precursor and the reactant comprises a halogen. Thus, in some embodiments the precursor comprises a compound that comprises a metal center and one or more ligands that comprise a halogen. Additionally or alternatively, and in some embodiments, the reactant comprises an elemental halogen or a compound comprising a halogen.

Thus, the precursor and the reactant are allowed to form a gap filling fluid that comprises the metal or the metalloid. In some embodiments, the gap filling fluid further comprises the halogen.

Of course, and in some embodiments, precursor or reactant can comprise more than one metal or metalloid. Thus, in some embodiments, the precursor comprises two or more metals. Additionally or alternatively, the precursor can comprise two or more metalloids. Or, the precursor can comprise at least one metal and at least one metalloid. In some embodiments, the reactant comprises two or more metals. Additionally or alternatively, the reactant can comprise two or more metalloids. Or, the reactant can comprise at least one metal and at least one metalloid.

In some embodiments, the gap filling fluid comprises oligomers that undergo chain growth as gaseous precursor polymerizes. Accordingly, a flowable oligomer-containing gap filling fluid can, in some embodiments, be temporarily formed on the substrate's surface that solidifies as the oligomers undergo chain growth. Thus, a flowable gap filling fluid can be obtained even at temperatures that are lower than the bulk melting point of a converted layer that is formed by means of a method as disclosed herein.

In some embodiments, the presently described methods can also be used at temperatures which exceed the bulk melting point of gap filling fluids formed by means of the presently described methods.

In some embodiments, a gap filling fluid can be formed even at process conditions at which a bulk gap filling fluid would normally not be expected to exist in a liquid state, e.g. at temperatures above the bulk gap filling fluid's dew point, or at pressures below the bulk gap filling fluid's critical pressure. In such cases, a gap filling fluid can be formed in gaps through surface tension and capillary effects that locally lower the vapor pressure at which liquid and gas are in equilibrium. In such cases, the gap filling fluid can, in some embodiments, be solidified by cooling the substrate down.

A gap filling fluid can be formed over the entire substrate surface, both outside gaps and inside gaps comprised in the substrate. When the gap filling fluid is formed both outside of the gaps and inside the gaps, the gap filling fluid can, in some exemplary modes of operation, be drawn into a gap by at least one of capillary forces, surface tension, and gravity.

The materials formed according to the present methods can be advantageously used in the field of integrated circuit manufacture.

Exemplary gaps include recesses, contact holes, vias, trenches, and the like. In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the precursor and the reactant thermally form the gap filling fluid. In other words, and in some embodiments, the gap filling fluid is formed by means of a thermal reaction between the precursor and the reactant. It shall be understood that a thermal process refers to a process in which the activation energy for thermal reactions in that process is substantially provided by thermal energy. Thus, there is no need for an additional energy source such as a plasma or energetic radiation such as ultraviolet radiation for causing the reaction to proceed.

In some embodiments, the precursor comprises an element that is selected from the list consisting of W, Ge, Sb, Te, Nb, Ta, V, Ti, Zr, Hf, Rh, Fe, Cr, Mo, Au, Pt, Ag, Ni, Cu, Co, Zn, Al, In, Sn, and Bi. Of course, and in some embodiments, the precursor can comprise more than one metals, more than one metalloid, or at least one metal and at least one metalloid.

In some embodiments, the precursor comprises a ligand that in turn comprises an alkyl-substituted benzene ring. Examples of such precursors include precursors comprising a metal center and one or more methylbenzene ligands, ethylbenzene ligands, or propylbenzene ligands. An exemplary precursor of this kind is bis(ethylbenzene)molybdenum. Precursors comprising an alkyl-substituted benzene ring such as bis(ethylbenzene)molybdenum can be advantageously used together with a haloalkane reactant such as 1,2-diiodoethane. Thus, in some embodiments, the precursor comprises bis(ethylbenzene)molybdenum, and the reactant comprises 1,2-diiodoethane.

In some embodiments, the precursor comprises a metal halide, for example a metal fluoride, a metal chloride, a metal bromide, or a metal iodide. An exemplary metal halide is vanadium tetrachloride. A metal halide precursor such as vanadium tetrachloride can be advantageously used together with an oxygen reactant such as water to form a metal and oxygen-containing gap filling fluid, such as a vanadium and oxygen-containing gap filling fluid, for example as is described in U.S. provisional application No. 63/155,382.

The reactant can, for example, comprise a bond selected from a X—X bond, a H—X bond, a C—X bond, a P—X bond, a N—X bond, and a S—X bond; wherein X is a halogen.

In some embodiments, the reactant comprises at least one of an elemental halogen and a hydrogen halide. Suitable elemental halogens include $F_2$, $Cl_2$, $Br_2$, and $I_2$. Suitable hydrogen halides include HF, HCl, HBr, and HI.

In some embodiments, the reactant comprises an alkyl halide. Suitable alkyl halides can have a chemical formula of $C_nH_{2n+2-m}X_m$, wherein n and m are integers from 1 to 4, and X is a halogen such as F, Cl, Br, and I. An exemplary alkyl halide is 1,2-diiodoethane.

When the precursor comprises a halogen, the reactant does not necessarily comprise a halogen. Suitable reactants that do not comprise a halogen include oxygen reactants, nitrogen reactants. Suitable oxygen reactants include $O_2$, $O_3$, $H_2O_2$, and $H_2O$. Suitable nitrogen reactants include $NH_3$ and $N_2H_2$.

In some embodiments, exposing the substrate to a precursor and to a reactant comprises one or more deposition cycles. A deposition cycle comprises a precursor pulse and a reactant pulse. The precursor pulse comprises exposing the substrate to the precursor. The reactant pulse comprises exposing the substrate to the reactant.

In some embodiments, a deposition cycle further comprises a nitrogen reactant pulse. The nitrogen reactant pulse comprises exposing the substrate to the nitrogen reactant.

The nitrogen reactant pulse can be executed, for example, after the precursor pulse, after the reactant pulse, or after a purge step following the precursor pulse or the reactant pulse.

In some embodiments, a deposition cycle comprises sequentially executing a plurality of subsequent precursor pulses and nitrogen reactant pulses before or after executing a reactant pulse. Thus, in some embodiments, a sequence of Y deposition cycles can be represented by the following formula: $((P+N)*X+R)*Y$, in which P denotes a precursor pulse, N denotes a nitrogen reactant pulse, X is an integer, R denotes a reactant pulse, and Y is another integer. In some embodiments, X equals Y. In some embodiments X and Y are different. Thus, a deposition cycle can comprise executing X sequences comprising a precursor pulse and a nitrogen reactant pulse, followed by a reactant pulse.

In some embodiments, the precursor and the reactant simultaneously form a liner and a gap filling fluid. In other words, and in some embodiments, while precursor and the reactant are allowed to form a gap filling fluid, the precursor and the reactant simultaneously react to form a conformal liner in the gap. Embodiments of such processes include the processes resulting in a molybdenum conformal liner and a molybdenum-containing gap filling fluid as described herein.

It shall be understood that the term "conformal liner" can refer to a layer that has a substantially constant thickness across a wafer's surface, irrespective of whether the liner is formed on a planar surface or in a recess or gap. For example, a conformal liner can have a thickness which is uniform within a margin of error of e.g. 50%, or 20%, or 10%, or 5%. This notwithstanding, a conformal liner can, in some embodiments, have a thickness which is higher at a distal end of a gap compared to a at substrate's surface outside that gap, for example by at least 1% to at most 5%, or by at least 5% to at most 10%, or by at least 10% to at most 20%, or by at least 20% to at most 50%, or by at least 1% to at most 50%. Conformal liners which exhibit a higher growth rate at a distal end of a gap compared to a substrate's surface outside of the gap can be suitably employed for filling gaps.

Simultaneously forming a gap filling fluid and a conformal liner can comprise executing a cyclical deposition process. The cyclical deposition process can include cyclical CVD, ALD, or a hybrid cyclical CVD/ALD process. For example, in some embodiments, the growth rate of a particular ALD process may be low compared to a CVD process. One approach to increase the growth rate may be that of operating at a higher deposition temperature than that typically employed in an ALD process, resulting in some portion of a chemical vapor deposition process, i.e. of at least one of non-self-limiting surface and gas phase reactions, but still taking advantage of the sequential introduction of reactants. Such a process may be referred to as cyclical CVD. In some embodiments, a cyclical CVD process may comprise the introduction of two or more precursors or reactants into the reaction chamber, wherein there may be a time period of overlap between the two or more precursors or reactants in the reaction chamber resulting in both an ALD component of the deposition and a CVD component of the deposition. This is referred to as a hybrid process. In accordance with further examples, a cyclical deposition process may comprise a continuous flow of one reactant or precursor and periodic pulsing of a second reactant or precursor into the reaction chamber.

In some embodiments, the conformal liner can have a thickness which is constant over the surface of the substrate, including in gaps, recesses, and the like, e.g. within a margin of error of 50%, 20%, 10%, 5%, 2%, 1%, 0.5%, or 0.1%.

In some embodiments, the conformal liner is deposited by means of a deposition method that yields a growth rate at a distal end of a gap that is higher than a growth rate outside of the gap. In some embodiments, the growth rate at the distal end of the gap is from at least 200% to at most 500%, or from at least 100% to at most 200%, or from at least 50% to at most 100%, or from at least 20% to at most 50%, or from at least 10% to at most 20%, or from at least 5% to at most 10%, or from at least 2% to at most 5%, or from at least 1% to at most 2% higher than the growth rate outside of the gap. This behavior was found in some embodiments of the presently described methods, e.g. when a molybdenum-containing gap filling fluid is formed together with a metallic molybdenum-containing conformal liner. This behavior is highly advantageous whenever it is desirable to fill a gap with a high-quality material without seam or void formation.

In some embodiments, the conformal liner is at least partially metallic. In some embodiments, the conformal liner comprises a metal alloy. Thus, and in some embodiments, the convertible layer comprises an elemental metal such as molybdenum, e.g. an elemental metal having an impurity content of less than 10 atomic percent, of less than 5 atomic percent, of less than 2 atomic percent, or less than 1 atomic percent.

In some embodiments, a method as described herein comprises a step of exposing the substrate to a transformation treatment. In other words, and in some embodiments, a method as described herein further comprises a step of curing the gap filling fluid. In some embodiments, curing can be performed after all of the gap filling fluid has been formed. Alternatively, curing can be done cyclically.

Any gap filling fluid formed by a method as described herein can be suitably subjected to a transformation treatment. In some embodiments, a molybdenum-containing gap filling fluid is subjected to a transformation treatment. Additionally or alternatively, a vanadium-containing gap filling fluid can be subjected to a transformation treatment.

A transformation treatment suitably comprises subjecting the substrate to a form of energy, e.g. at least one of heat energy, radiation, and particles. Exemplary treatments comprise exposing the substrate to UV radiation. Additionally or alternatively, a transformation treatment can comprise exposing the substrate to a direct plasma, e.g. a noble gas plasma such as an argon plasma. Additionally or alternatively, a transformation treatment can comprise exposing the substrate to one or more reactive species such as ions and/or radicals generated in a remote plasma, e.g. a remote noble gas plasma, such as a remote argon plasma. Additionally or alternatively, a transformation treatment can comprise exposing the substrate to photons, e.g. at least one of UV photons, photons in the visible spectrum, IR photons, and photons in the microwave spectrum. Additionally or alternatively, a transformation treatment can comprise heating the substrate.

In some embodiments, the transformation treatment comprises exposing the substrate to a plasma. Suitable plasmas include direct plasmas, remote plasmas, and microwave plasmas. A plasma treatment can suitably be performed in a cyclical manner, e.g. after a deposition step in a super cycle. Additionally or alternatively, a plasma treatment can be performed as a post-deposition treatment.

In some embodiments, exposing the substrate to a plasma employs generating a plasma by means of a plasma gas that comprises at least one of an oxidizing agent, a nitridation agent, a reducing agent, and an inert gas.

Employing a plasma gas comprising an oxidizing agent can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Employing a plasma gas comprising a nitridation agent can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Employing a plasma gas comprising a reducing agent, or a plasma gas that substantially consists of one or more noble gasses, can result in can result in formation of a metallic substance in the gap comprised in the substrate. For example, this can occur through volatilization of the halogens contained in the metal and halogen-containing gap filling fluid. Suitable inert atmospheres include atmospheres that substantially consist of a noble gas. Suitable reducing atmospheres include $H_2$.

In some embodiments, the transformation treatment comprises exposing the substrate to at least one of radicals and ions. For example, a direct plasma treatment can comprise exposing the substrate to radicals and ions. For example, a remote plasma treatment can comprise exposing the substrate to radicals only.

In some embodiments, the transformation treatment comprises exposing the substrate to a thermal anneal. Suitable anneals are known in the Art as such, and include spike anneals, rapid thermal anneals (RTA), and soak anneals. A thermal anneal can suitably be performed in a cyclical manner, e.g. after a deposition step in a super cycle. Additionally or alternatively, an anneal can be performed as a post-deposition treatment.

In some embodiments, the thermal anneal comprises at least one of exposing the substrate to an oxidizing agent, a nitridation agent, a reducing agent, and an inert gas.

Exposing the substrate to an oxidizing agent during the thermal anneal can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Exposing the substrate to a nitridation agent during the thermal anneal can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Exposing the substrate to a reducing agent or to an inert atmosphere during the thermal anneal can result in formation of a metallic substance in the gap comprised in the substrate. For example, this can occur through volatilization of the halogens contained in the metal and halogen-containing gap filling fluid. Suitable inert atmospheres include atmospheres that substantially consist of a noble gas. Suitable reducing atmospheres include $H_2$.

In some embodiments, the transformation treatment comprises exposing the substrate to ultraviolet radiation. Exposing the substrate to ultraviolet radiation can occurs, for example, while exposing the substrate to at least one of an oxidizing agent, a nitridation agent, a reducing agent, and an inert gas. Exposing the substrate to ultraviolet radiation can suitably result in a treatment having a higher penetration depth, thereby affecting more material. Exposing the substrate to ultraviolet radiation can, in some embodiments, be more efficient than exposing the substrate to a thermal treatment.

In some embodiments, exposing the substrate to ultraviolet radiation comprises at least one of exposing the substrate to an oxidizing agent, a nitridation agent, a reducing agent, and an inert gas.

Exposing the substrate to an oxidizing agent while exposing the substrate to ultraviolet radiation can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Exposing the substrate to a nitridation agent while exposing the substrate to ultraviolet radiation can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Exposing the substrate to a reducing agent or to an inert atmosphere while exposing the substrate to ultraviolet radiation can result in formation of a metallic substance in the gap comprised in the substrate. For example, this can occur through volatilization of the halogens contained in the metal and halogen-containing gap filling fluid. Suitable inert atmospheres include atmospheres that substantially consist of a noble gas. Suitable reducing atmospheres include $H_2$.

In some embodiments, a transformation treatment comprises exposing the substrate to a reduction step and to an oxidation step. In some embodiments, the reduction step precedes the oxidation step. Alternatively, the oxidation step can precede the reduction step. In some embodiments, the reduction step comprises exposing the substrate to a hydrogen plasma. In some embodiments, the oxidation step comprises exposing the substrate to an oxygen plasma.

In some embodiments, transforming the gap filling fluid comprises exposing the substrate to a reduction step and to a nitridation step. It shall be understood that a nitridation step refers to a step of converting a material into a nitride. In some embodiments, the reduction step precedes the nitridation step. Alternatively, the nitridation step can precede the reduction step. In some embodiments, the reduction step comprises exposing the substrate to a hydrogen plasma. In some embodiments, the nitridation step comprises exposing the substrate to a nitrogen plasma. Suitable nitrogen plasmas include plasmas in which the plasma gas comprises at least one of $N_2$, $NH_3$, and $N_2H_2$.

In some embodiments, the substrate is exposed to the transformation treatment for a duration of at least 0.1 s to at most 1000 s, or of at least 0.2 s to at most 500 s, or of at least 0.5 s to at most 200 s, or of at least 1.0 s to at most 100 s, or of at least 2 s to at most 50 s, or of at least 5 s to at most 20 s.

The transformation treatment can, in some embodiments, be carried out once after the gap has been filled, or it can be carried out multiple times, i.e. gap filling steps and transformation steps can be carried out alternatingly and cyclically in order to fill a gap with a transformed material. Thus, in some embodiments, a method as described herein comprises a plurality of super cycles. A super cycle comprises a step of at least partially filling a gap comprised in a substrate with a gap filling fluid and a step of exposing the substrate to a transformation treatment. For example, a method as described herein can comprise from at least 2 to at most 5, or from at least 5 to at most 10, or from at least 10 to at most 20, or from at least 20 to at most 50, or from at least 50 to at most 100 super cycles.

A super cycle can, in some embodiments, comprise a plurality of halogen-containing precursor pulses, reactant pulses, and nitrogen reactant pulses. For example, and in some embodiments, a super cycle comprises sequentially executing a plurality of subsequent precursor pulses and reactant pulses before or after executing a nitrogen reactant pulse. Thus, in some embodiments, a sequence of Y super cycles can be represented by the following formula: $((P+R)*X+N)*Y$, in which P denotes a precursor pulse, N denotes a nitrogen reactant pulse, X is an integer, R denotes a reactant pulse, and Y is another integer. In some embodiments, X equals Y. In some embodiments X and Y are different. Thus, a super cycle can comprise executing X sequences comprising a precursor pulse and a reactant pulse, followed by a nitrogen reactant pulse. In some embodiments, X is from at least 1 to at most 100, or from at least 2 to at most 50, or from at least 5 to at most 20. In some embodiments, Y is from at least 1 to at most 100, or from at least 2 to at most 50, or from at least 5 to at most 20.

In an exemplary embodiment, the precursor comprises a molybdenum-containing precursor such as $(CpEt)_2Mo$, the reactant comprises a halogen-containing reactant such as $CH_2I-CH_2I$, and the nitrogen reactant comprises a nitrogen and hydrogen containing compound such as $NH_3$.

In a further exemplary embodiment, the precursor comprises a vanadium-containing precursor such as $VCl_4$, the reactant comprises an oxygen-containing compound such as $H_2O$, and the nitrogen reactant comprises a nitrogen-containing compound such as $NH_3$. In some embodiments, the substrate is maintained at a temperature of at least $-25°$ C. to at most $400°$ C., or at a temperature of at least $0°$ C. to at most $200°$ C., or at a temperature of at least $25°$ C. to at most $150°$ C., or at a temperature of at least $50°$ C. to at most $100°$ C. during at least one of forming a gap filling fluid and during the transformation treatment.

In some embodiments, and while the gap filling fluid is transformed into a transformed material, the substrate is maintained at a temperature of less than $800°$ C., or of at least $-25°$ C. to at most $800°$ C., or of at least $0°$ C. to at most $700°$ C., or of at least $25°$ C. to at most $600°$ C., or of at least $50°$ C. to at most $400°$ C., or of at least $75°$ C. to at most $200°$ C., or of at least $100°$ C. to at most $150°$ C. In some embodiments, the temperature at which the substrate is maintained while the gap filling fluid is formed equals the temperature at which the substrate is maintained while the gap filling fluid is transformed into a transformed material.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the convertible layer is deposited at a pressure of at mot 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.2 Torr to at most 5 Torr, or at a pressure of at least 0.5 Torr to at most 2.0 Torr.

In some embodiments, the precursor comprises an element selected from Ge, Sb, and Te.

Suitably, when the precursor Ge, the reactant can contain a fluorine-containing gas or vapor. Thus, a gap filling fluid comprising at least one of $GeF_2$ and $GeF_4$ can be formed.

Suitably, when the precursor comprises Sb, the reactant can contain a fluorine-containing gas or vapor. Thus, a gap filling fluid comprising at least one of $SbF_3$ and $SbF_5$ can be formed.

Suitably, when the precursor comprises Te, the reactant can contain a bromine-containing gas or vapor. Thus, a gap filling fluid comprising $Te_2Br$ can be formed.

In some embodiments, the precursor can comprise an element selected from Nb, Ta, V, Ti, Zr, and Hf.

In some embodiments, the precursor can comprise niobium (Nb). In such embodiments, the reactant can suitably comprise at least one of chlorine and iodine. Accordingly, a gap filling fluid comprising at least one of $NbCl_4$ and $NbI_5$ can be formed.

In some embodiments, the precursor can comprise tantalum (Ta). In such embodiments, the reactant can suitably comprise one of fluorine, chlorine, bromine, and iodine.

Accordingly, a gap filling fluid comprising at least one of $TaCl_5$, $TaI_5$, $TaF_5$, and $TaBr_5$ can be formed.

In some embodiments, the precursor can comprise vanadium (V). In such embodiments, the reactant can suitably comprise one of fluorine and bromine. Accordingly, a gap filling fluid comprising at least one of $VF_4$, $VF_5$, $VBr_3$ can be formed.

In some embodiments, the precursor can comprise titanium (Ti). In such embodiments, the reactant can suitably comprise fluorine. Accordingly, a gap filling fluid comprising $TiF_4$ can be formed.

In some embodiments, the precursor can comprise zirconium (Zr). In such embodiments, the reactant can suitably comprise one of chlorine, bromine, and iodine. Accordingly, a gap filling fluid comprising at least one of $ZrI_4$, $ZrCl_4$, and $ZrBr_4$ can be formed.

In some embodiments, the precursor can comprise hafnium (Hf). In such embodiments, the reactant can suitably comprise one of chlorine and iodine. Accordingly, a gap filling fluid comprising at least one of $HfCl_4$ and $HfI_4$ can be formed.

In some embodiments, the precursor can comprise rhodium (Rh). In such embodiments, the reactant can suitably comprise bromine. Accordingly, a gap filling fluid comprising $RhBr_3$ can be formed.

In some embodiments, the precursor can comprise iron (Fe). In such embodiments, the reactant can suitably comprise bromine. Accordingly, a gap filling fluid comprising at least one of $FeBr_3$ and $FeBr_2$ can be formed.

In some embodiments, the precursor can comprise chromium (Cr). In such embodiments, the reactant can suitably comprise fluorine. Accordingly, a gap filling fluid comprising $CrF_5$ can be formed.

In some embodiments, the precursor can comprise molybdenum (Mo). In such embodiments, the reactant can suitably comprise chlorine, bromine, or iodine. Accordingly, a gap filling fluid comprising at least one of $Mo_6Cl_{12}$, $MoCl_4$, $MoI_3$, and $MoBr_3$ can be formed.

In some embodiments, the precursor comprises gold (Au). In such embodiments, the reactant can suitably comprise fluorine or bromine. Accordingly, a gap filling fluid comprising at least one of $AuF_3$ and $AuBr$ can be formed.

In some embodiments, the precursor comprises silver (Ag). In such embodiments, the reactant can suitably comprise fluorine. Accordingly, a gap filling fluid comprising $AgF_3$ can be formed.

In some embodiments, the precursor comprises platinum (Pt). In such embodiments, the reactant can suitably comprise bromine. Accordingly, a gap filling fluid comprising $PtBr_4$ can be formed.

In some embodiments, the precursor comprises nickel (Ni). In such embodiments, the reactant can suitably comprise bromine. Accordingly, a gap filling fluid comprising $NiBr_2$ can be formed.

In some embodiments, the precursor comprises copper (Cu). In such embodiments, the reactant can suitably comprise bromine. Accordingly, a gap filling fluid comprising $CuBr_2$ can be formed.

In some embodiments, the precursor comprises cobalt (Co). In such embodiments, the reactant can suitably comprise iodine. Accordingly, a gap filling fluid comprising $CoI$ can be formed.

In some embodiments, the precursor comprises zinc (Zn), for example metallic Zn or an inorganic Zn compound. In such embodiments, the reactant can suitably comprise at least one of chlorine and iodine. Accordingly, a gap filling fluid comprising at least one of $ZnCl_2$ and $ZnI_2$ can be formed.

In some embodiments, the precursor can comprise aluminum (Al). In such embodiments, the reactant can suitably comprise chlorine or iodine. Accordingly, a gap filling fluid comprising at least one of $AlCl_3$ and $AlI_3$ can be formed.

In some embodiments, the precursor can comprise indium (In). In such embodiments, the reactant can suitably comprise bromine. Accordingly, a gap filling fluid comprising $InBr_3$ can be formed.

In some embodiments, the precursor comprises tin (Sn). In such embodiments, the reactant can suitably comprise at least one of chlorine and bromine. Accordingly, a gap filling fluid comprising at least one of $SnCl_2$ and $SnBr_2$ can be formed.

In some embodiments, the precursor can comprise bismuth (Bi). In such embodiments, the reactant can suitably comprise fluorine. Accordingly, a gap filling fluid comprising $BiF_5$ can be formed.

Described herein is a system comprising a reaction chamber, a precursor gas source, a deposition reactant gas source, and a controller. The precursor gas source comprises a metal precursor. The deposition reactant gas source comprises a deposition reactant. The controller is configured to control gas flow into the reaction chamber to form a layer on a substrate by means of a method as described herein.

Optionally, the system further comprises one or more of an active species source and a transformation reactant source. The active species source is, if present, arranged for providing an active species to the reaction chamber. The transformation reactant source is, if present, arranged for providing a conversion reactant to the reaction chamber.

In some embodiments, the system comprises two distinct, i.e. separate, reaction chambers: a first reaction chamber and a second reaction chamber. The first reaction chamber is configured for forming a gap filling fluid on the substrate. The second reaction chamber is configured for converting the gap filling fluid into a converted material. In some embodiments, the first reaction chamber is maintained at a first reaction chamber temperature, and the second reaction chamber is maintained at a second reaction chamber temperature. In some embodiments, the first reaction chamber temperature is lower than the second reaction chamber temperature, for example from at least 10° C. lower to at most 100° C. lower. In some embodiments, the first reaction chamber temperature is higher than the second reaction chamber temperature, for example from at least 10° C. higher to at most 100° C. higher. In some embodiments, the first reaction chamber temperature is equal to the second reaction chamber temperature, e.g. within a margin of 10° C., 20° C., 30° C., or 40° C.

In accordance with yet additional embodiments of the disclosure, a device or portion thereof can be formed using a method and/or a structure as described herein. The device can include a substrate, one or more insulating layers, one or more metallic layers, and one or more semiconducting layers. The device further comprises a gap filled using a method as disclosed herein.

Further described is a field effect transistor comprising a gate contact comprising a layer formed according to a method as described herein.

Further described is a metal contact comprising a layer deposited by means of a method as described herein.

Further provided herein is a metal-insulator-metal (MIM) capacitor comprising an electrode comprising a material formed by means of a method as described herein.

FIG. 1 shows a schematic representation of an embodiment of a method as described herein. The method can be used, for example, in order to form an electrode in a semiconductor device. However, unless otherwise noted, the presently described methods are not limited to such applications. The method comprises a step (111) of positioning a substrate on a substrate support. The substrate support is positioned in a reaction chamber. Suitable substrate supports include pedestals, susceptors, and the like. The method further comprises filling a gap comprised in the substrate (112) with a gap filling fluid. Suitable gap filling fluids and methods of forming them are described elsewhere herein. Optionally, the reaction chamber is then purged. When a sufficient amount of gap filling fluid has been formed in the gap, the method ends (113).

Purging can be done by exposing the substrate to a purge gas that, in turn, can be done, for example, by providing a purge gas to the reaction chamber. Exemplary purge gasses include noble gasses. Exemplary noble gasses include He, Ne, Ar, Xe, and Kr. Alternatively, the purging can comprise transporting the substrate through a purge gas curtain. During a purge, surplus chemicals and reaction byproducts, if any, can be removed from the substrate surface or reaction chamber, such as by purging the reaction space or by moving the substrate, before the substrate is subjected to a next step.

Figure 2:
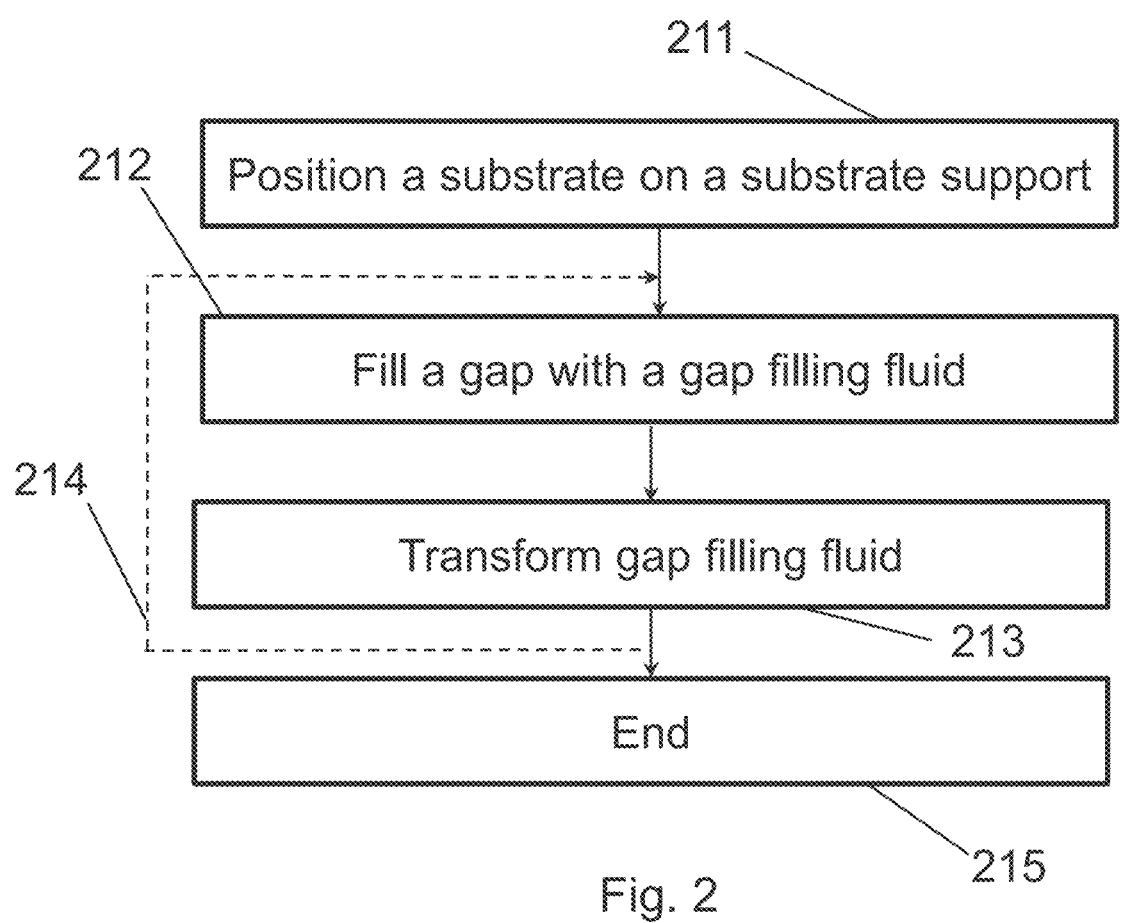
FIG. 2 illustrates an embodiment of a method as disclosed herein.

FIG. 2 schematically shows another embodiment of a method as described herein. The method of FIG. 2 is similar to that of FIG. 1 in the sense that it also comprises positioning a substrate on a substrate support (211) and filling a gap with a gap filling fluid (212). The method of FIG. 2 differs from the method of FIG. 1 in that it further comprises a step of transforming the gap filling fluid (213) to form a transformed material. Optionally, a purge is carried out after the step of transforming the gap filling fluid (213). The step of transforming the gap filling fluid (213) can comprise, for example, exposing the substrate to a direct plasma such as a direct oxygen plasma or a direct nitrogen plasma. Optionally, the method of FIG. 2 comprises a plurality of super cycles (214) in which the steps filling the gap with the gap filling fluid (212) and transforming the gap filling fluid (213) are repeated one or more times. After a pre-determined amount of converted material has been formed on the substrate, the method of FIG. 2 ends (215).

Figure 3:
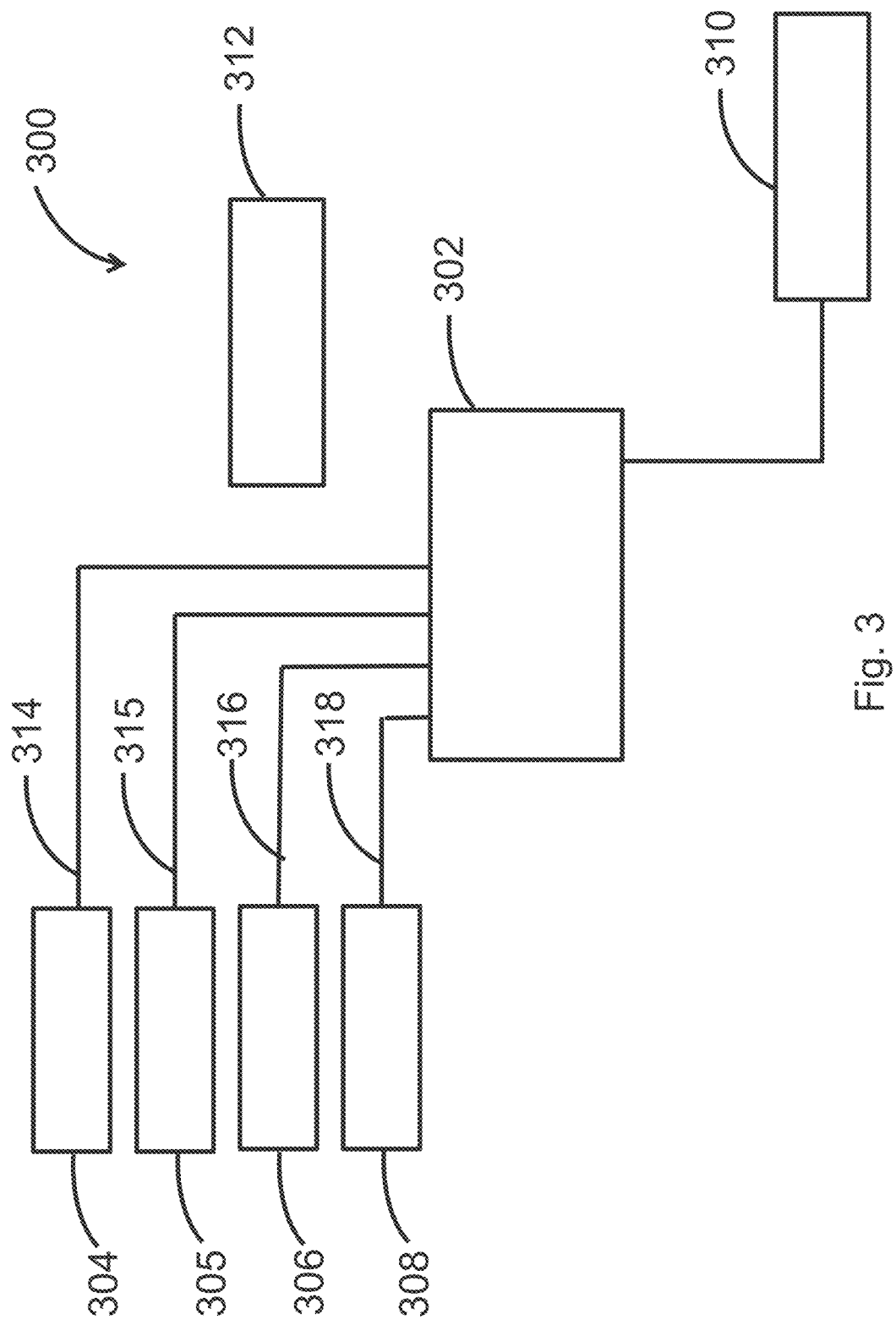
FIG. 3 illustrates an embodiment of a system (300) in accordance with yet additional exemplary embodiments of the disclosure.

FIG. 3 illustrates a system (300) in accordance with yet additional exemplary embodiments of the disclosure. The system (300) can be used to perform a method as described herein and/or form a structure or device portion, e.g. in an integrated circuit, as described herein.

In the illustrated example, the system (300) includes one or more reaction chambers (302), a precursor gas source (304), a reactant gas source (306), a purge gas source (308), an exhaust (310), and a controller (312).

The reaction chamber (302) can include any suitable reaction chamber, such as an ALD or CVD reaction chamber. In some embodiments, the reaction chamber comprises a showerhead injector and a substrate support (not shown).

The precursor gas source (304) can include a vessel and one or more precursors as described herein—alone or mixed with one or more carrier (e.g., noble) gases. The reactant gas source (306) can include a vessel and one or more reactants as described herein—alone or mixed with one or more carrier gases. The purge gas source (308) can include one or more inert gases as described herein. Although illustrated with four gas sources (304-308), the system (300) can include any suitable number of gas sources. The gas sources (304-308) can be coupled to reaction chamber (302) via lines (314-318), which can each include flow controllers, valves, heaters, and the like. The exhaust (310) can include one or more vacuum pumps.

The controller (312) includes electronic circuitry and software to selectively operate valves, manifolds, heaters, pumps and other components included in the system (300). Such circuitry and components operate to introduce precursors, reactants, and purge gases from the respective sources (304-308). The controller (312) can control timing of gas pulse sequences, temperature of the substrate and/or reaction chamber, pressure within the reaction chamber, and various other operations to provide proper operation of the system (300). The controller (312) can include control software to electrically or pneumatically control valves to control flow of precursors, reactants and purge gases into and out of the reaction chamber (302). The controller (312) can include modules such as a software or hardware component, e.g., a FPGA or ASIC, which performs certain tasks. A module can advantageously be configured to reside on the addressable storage medium of the control system and be configured to execute one or more processes.

Other configurations of the system (300) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (402). Further, as a schematic representation of a system, many components have been omitted for simplicity of illustration, and such components may include, for example, various valves, manifolds, purifiers, heaters, containers, vents, and/or bypasses.

During operation of the system (300), substrates, such as semiconductor wafers (not illustrated), are transferred from, e.g., a substrate handling system to a reaction chamber (302). Once such substrate(s) are transferred to reaction chamber (302), one or more gases from the gas sources (304-308), such as precursors, reactants, carrier gases, and/or purge gases, are introduced into the reaction chamber (302).

Figure 4:
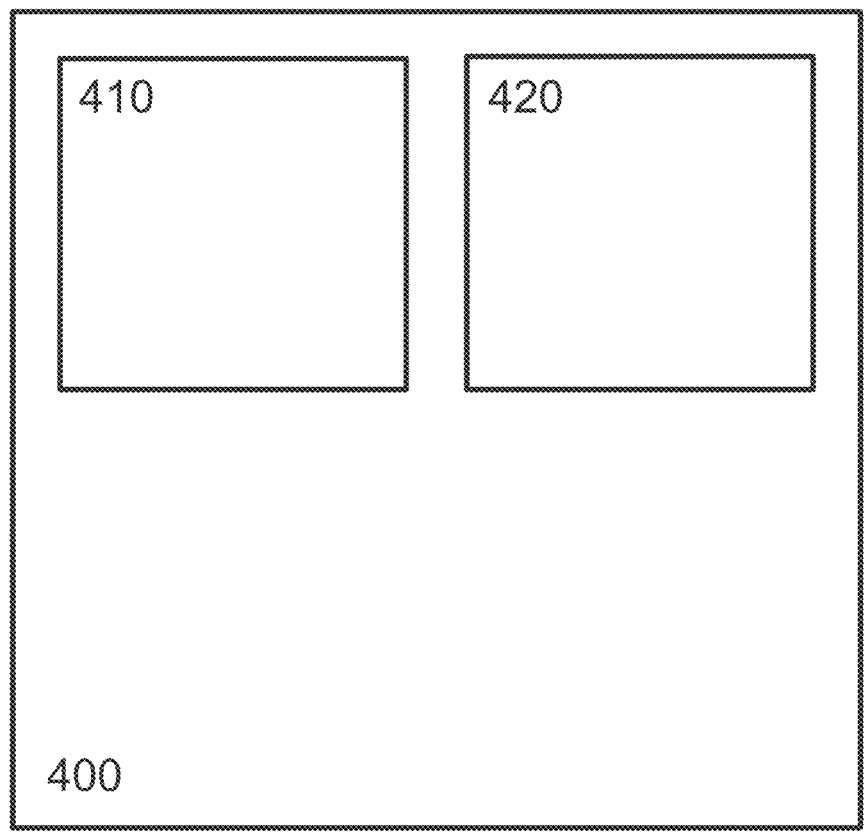
FIG. 4 shows another embodiment of a system (400) as described herein in a stylized way.

FIG. 4 shows another embodiment of a system (400) as described herein in a stylized way. The system (400) of FIG. 4 is similar to that of FIG. 3. It comprises two distinct reaction chambers: a first reaction chamber (410) and a second reaction chamber (420). The first reaction chamber (410) is arranged for filling a gap with a gap filling fluid. The second reaction chamber (420) is arranged for transforming a gap filling fluid into a transformed material.

Figure 5:
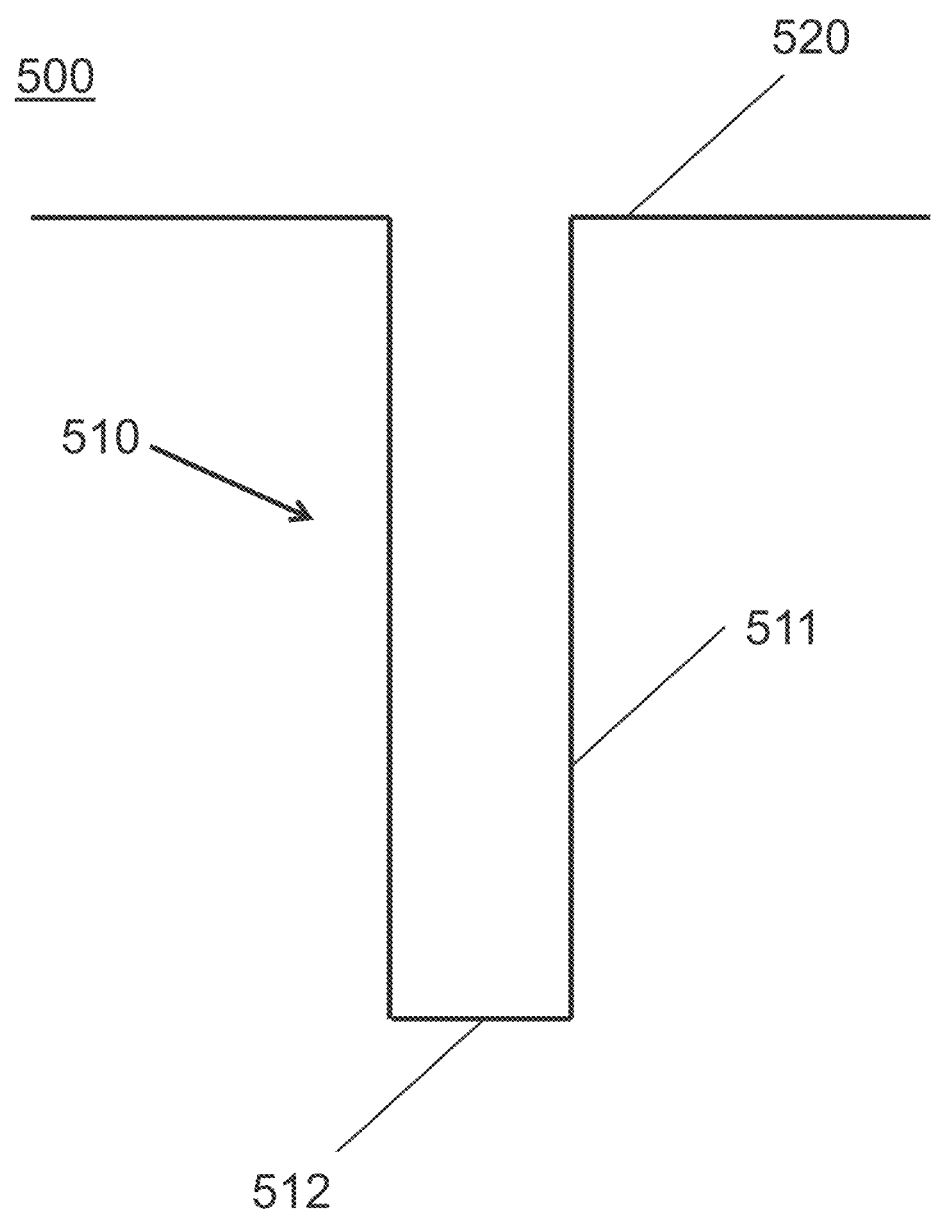
FIG. 5 shows a stylized representation of a substrate (500) comprising a gap (510).

FIG. 5 shows a schematic representation of a substrate (500) comprising a gap (510). The gap (510) comprises a sidewall (511) and a distal end (512). The substrate further comprises a proximal surface (520). In some embodiments, the sidewall (511), the distal end (512) comprise the same material. In some embodiments, at least one of the sidewall (511) and the distal end comprise a dielectric, such as a silicon containing dielectric such as silicon oxide, silicon nitride, silicon carbide, and mixtures thereof. In some embodiments, the dielectric comprises hydrogen. In some embodiments, at least one of the sidewall (511) and the distal end (512) comprise a metal such as a transition metal, a post transition metal, and a rare earth metal. In some embodiments, the metal comprises Cu, Co, W, Ru, Mo, Al, or an alloy thereof.

In some embodiments, the sidewall (511) and the distal end (512) have an identical, or a substantially identical, composition. In some embodiments, the sidewall (511) and the distal end (512) have a different composition. In some embodiments, the sidewall and the distal end (512) comprise a dielectric. In some embodiments, the sidewall (511) and the distal end (512) comprise a metal. In some embodiments, the sidewall (511) comprises a metal and the distal end (512) comprises a dielectric. In some embodiments, the sidewall (511) comprises a dielectric and the distal end comprises a metal.

In some embodiments, the proximal surface (520) has the same composition as the sidewall (511). In some embodiments, the proximal surface (520) has a different composition than the sidewall (511). In some embodiments, the proximal surface (520) has a different composition than the distal end (512). In some embodiments, the proximal surface (520) has the same composition as the distal end (512).

In some embodiments, the proximal surface (520), the sidewall (511), and the distal end (512) comprise the same material. In some embodiments, the proximal surface (520), the sidewall (511), and the distal end (512) comprise a dielectric. In some embodiments, the proximal surface (520), the sidewall (511), and the distal end (512) comprise a metal. In some embodiments, the proximal surface (520), the sidewall (511), and the distal end (512) comprise a semiconductor.

In a specific embodiment, a method as described herein comprises simultaneously exposing the substrate to a molybdenum precursor on the one hand, and a catalyst such as pyridine. Suitably the substrate can be exposed to a gas mixture comprising the precursor and the catalyst in a one-to-one ratio. Suitable susceptor temperatures are 200° C. or less, and suitable pressures of the gas mixture to which the substrate is exposed are 1000 Pa or more. Thus, the gap can be filled with a molybdenum containing substance such as $Mo_6Cl_{12}$ or $MoCl_5$.

Figure 6:
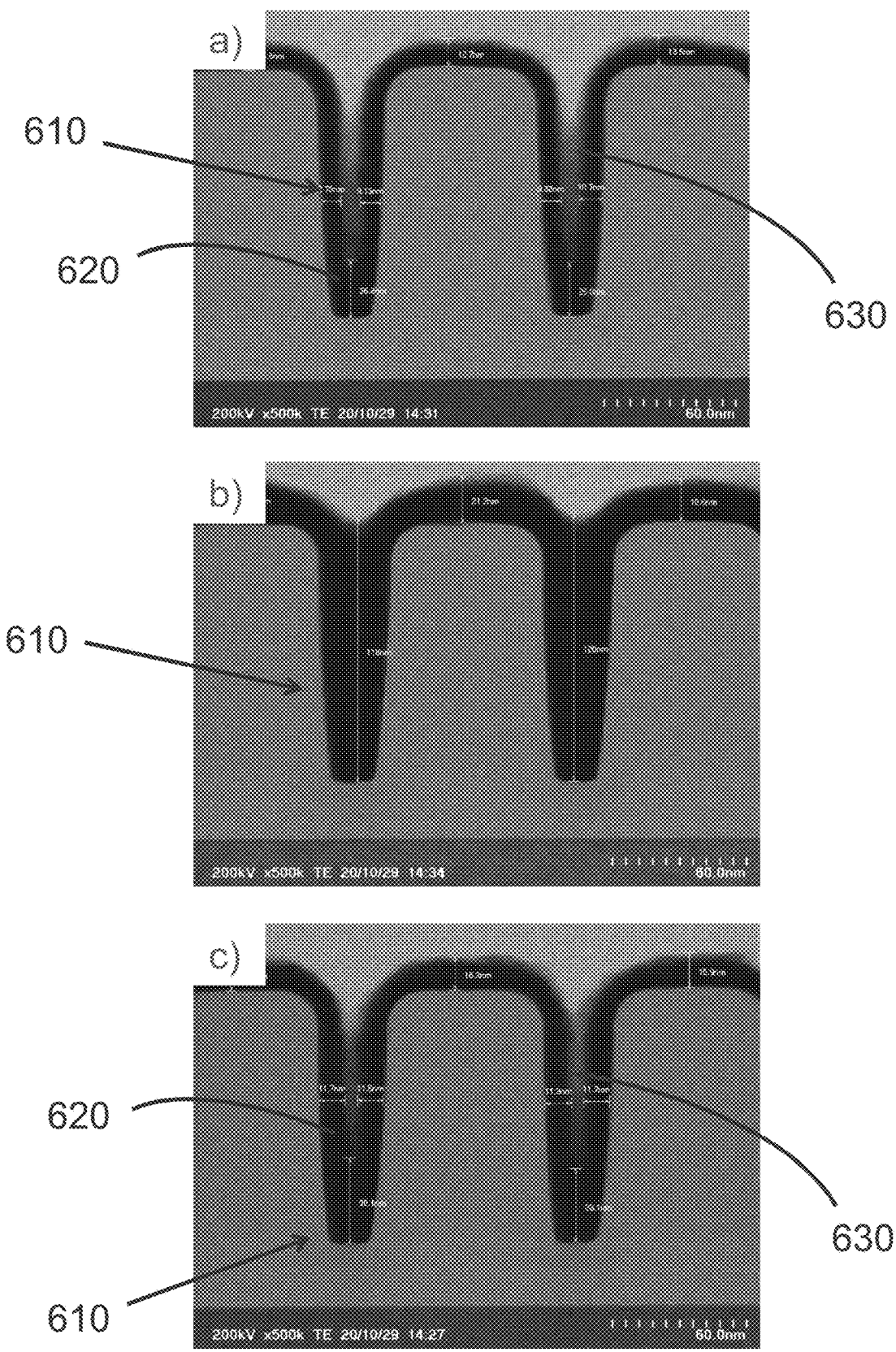
FIGS. 6-10 show experimental data obtained on gaps that were filled with a gap filling fluid in accordance with embodiments of the present disclosure.

In a further example, reference is made to FIG. 6. FIG. 6 shows experimental data, in particular scanning transmission electron microscopy (STEM) images, obtained on structures which comprise a gap filling fluid formed by means of a method as described herein. In particular, bis(ethylbenzene)molybdenum, $Mo(EtBz)_2$, is used as a precursor, and 1,2-diiodoethane as a reactant. The substrate is sequentially exposed to precursor in precursor pulses and to reactant in reactant pulses. This process results in formation of a metallic molybdenum film on planar substrates. Surprisingly, the same process results in formation of two distinct materials in gaps (610). On the one hand, a liner (620) comprising metallic molybdenum is formed. On the other hand, a gap filling fluid (630) is formed as well. The metallic nature of the molybdenum liner (620), and the presence of molybdenum in the gap filling fluid (630) was confirmed by means of X-ray Photoelectron Spectroscopy (XPS) measurements.

The samples shown in FIG. 6, panels a) and b) underwent a cyclical deposition process at a substrate temperature of at least 325° C. to at most 325° C. A precursor pulse time of 12 seconds was used. After the precursor pulse, a purge time of 10 seconds was used. A reactant pulse time of 10 seconds was used. After the reactant pulse, a purge time of 10 seconds was used. The sample of panel a) was subjected to 75 deposition cycles, which results in liner formation (620) and in partial filling of the gap (610) with a gap filling fluid (630). The sample of panel b) was subjected to 110 deposition cycles. This surprisingly results in complete filling of the gap (630) without seam formation.

The sample shown in FIG. 6, panel c) underwent a cyclical deposition process at a substrate temperature of at least 325° C. to at most 350° C. Pulse and purge times were the same as for the samples shown in FIG. 7, panels a) and b). The sample of panel c) was subjected to 55 deposition cycles, which results in liner formation (620) and in partial filling of the gap (610) with a gap filling fluid (630).

In a further exemplary embodiment, reference is made to FIGS. 7, 8, 9, and 10.

Figure 7:
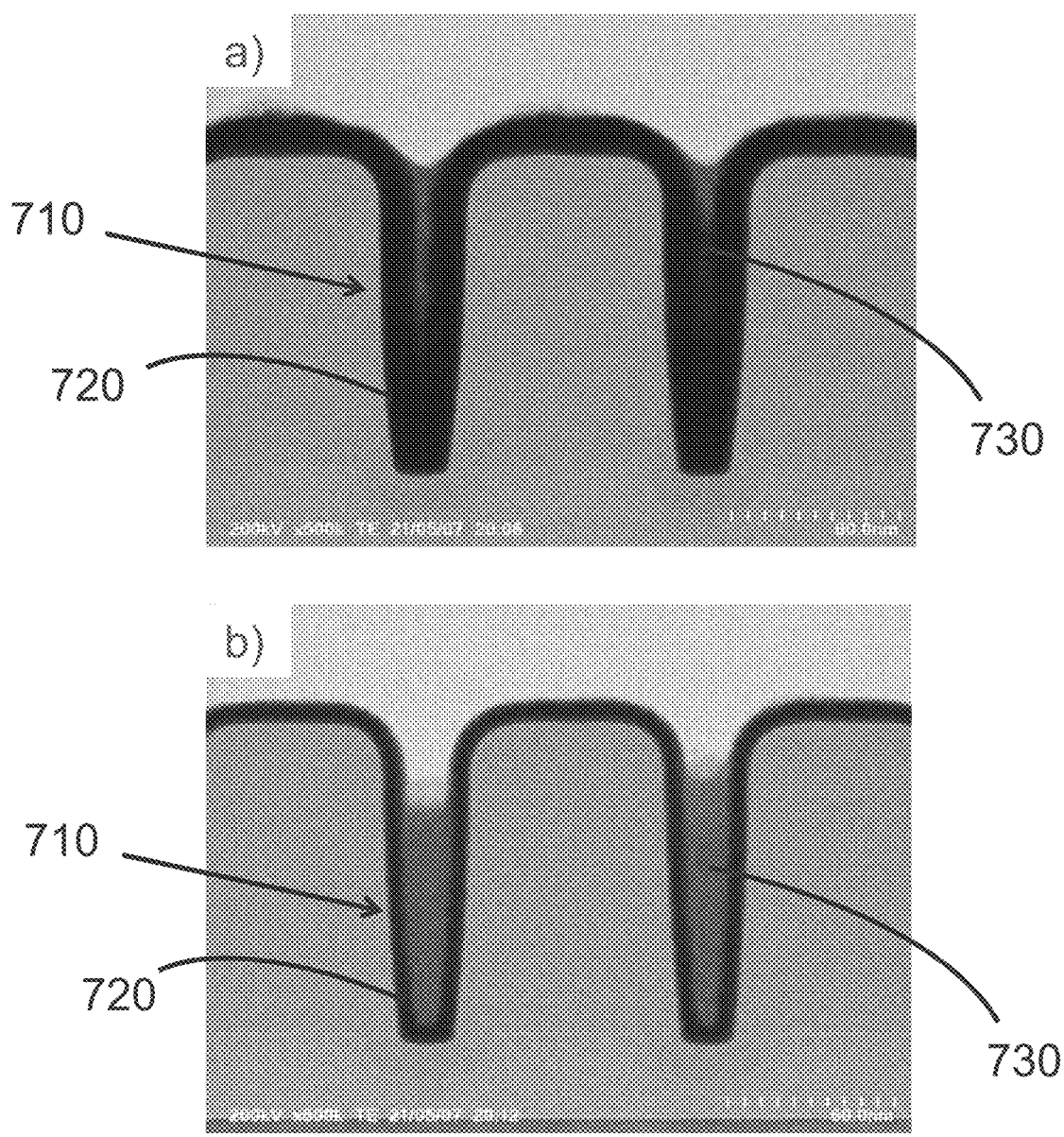

FIG. 7 panels a) and b) show gaps (710) having a critical dimension of 30 nm that have been partially filled by means of an embodiment of a method as described herein. The process the results of which are shown in panel a) resulted primarily in formation of a conformal liner (720), and to a lesser extent in formation of a gap filling fluid (730). The process the results of which are shown in panel b) primarily results in formation of a gap filling fluid (730), and to a lesser extent in formation of a liner (720).

In particular, FIG. 7 panel a) shows gaps that were filled using a thermal ALD process comprising 78 deposition cycles. A deposition cycle comprises, in the order given, a precursor pulse, a reactant pulse, and a nitrogen reactant pulse. The precursor used was bis(ethylbenzene)molybdenum, the reactant was 1,2-diiodoethane, and the nitrogen reactant was ammonia. The precursor pulse lasted 10 seconds, and it was followed by a 5 second purge. The reactant pulse lasted 0.5 seconds, and it was followed by a 5 second purge. The nitrogen reactant pulse lasted 8 seconds, and was followed by a 5 second purge. The process was carried out at a susceptor temperature of 350° C. and at a pressure of 5 Torr.

FIG. 7 panel b) shows gaps that were filled using a thermal ALD process comprising 10 deposition cycles. Each deposition cycle comprises a sequence of 10 sub-cycles followed by a reactant pulse. A sub-cycle comprises a precursor pulse and a nitrogen reactant pulse. The precursor used was bis(ethylbenzene)molybdenum, the reactant was 1,2-diiodoethane, and the nitrogen reactant was ammonia. The precursor pulse lasted 10 seconds and was followed by a 5 second purge. The nitrogen reactant pulse lasted 8 seconds and was followed by a 5 second purge. The reactant pulse lasted 0.5 seconds and was followed by a 5 second purge. The process was carried out at a susceptor temperature of 350° C. and at a pressure of 5 Torr.

Figure 8:
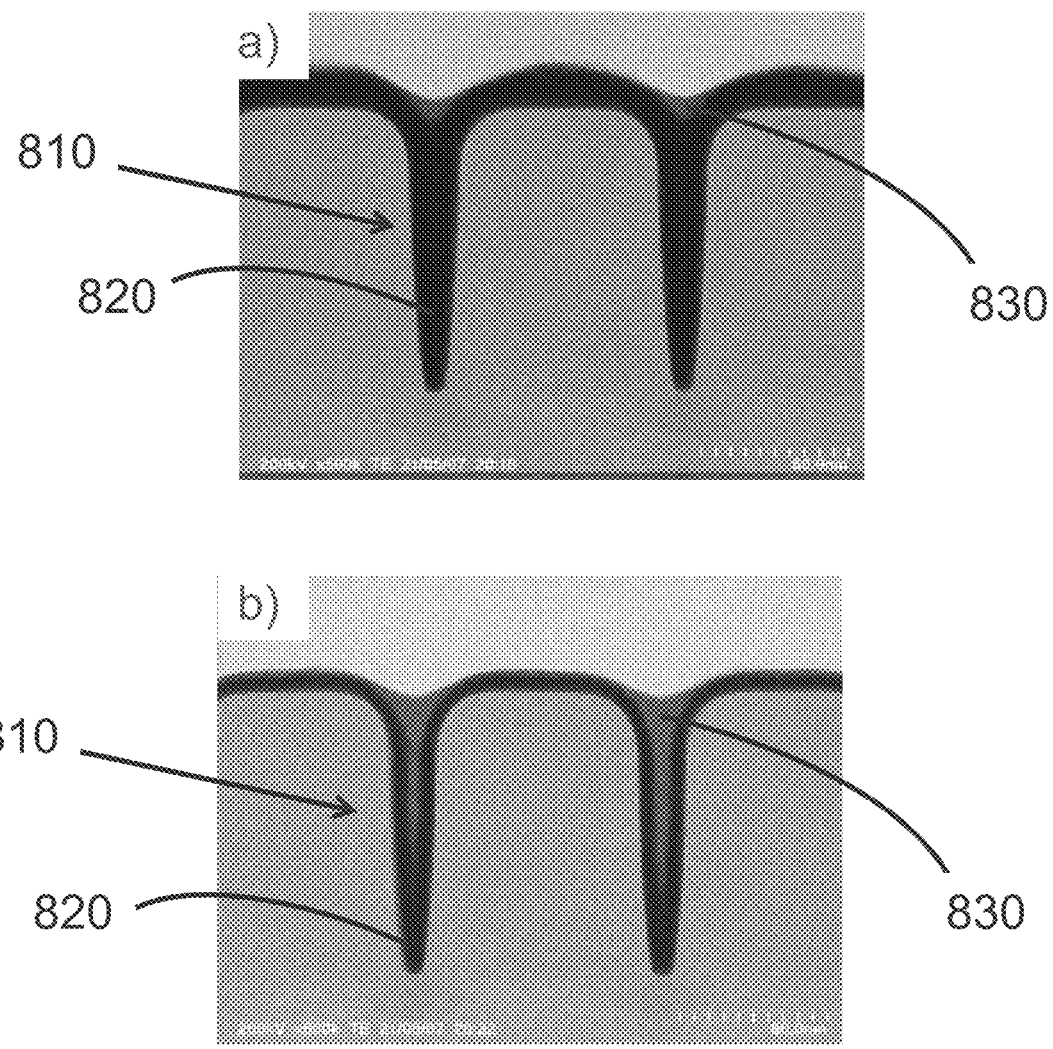

FIG. 8 panels a) and b) show gaps that have a critical dimension of 20 nm, and are therefore smaller than the gaps shown in FIG. 7.

FIG. 8 panel a) shows gaps (810) that were filled using the same process as the process that was used to fill the gaps (710) shown in FIG. 7 panel a). Due to the smaller size of the gaps (810) of FIG. 8 panel a), these gaps (810) are completely filled with conformal liner (720). Only a minor amount of gap filling fluid (830) is visible on top of the conformal liner (820). Surprisingly and advantageously, no substantial seam or void is formed.

FIG. 8 panel b) shows gaps (810) that were filled using the same process as the process that was used to fill the gaps (710) shown in FIG. 7 panel b). A thin conformal liner (820) and a gap filling fluid (830) are visible.

Figure 9:
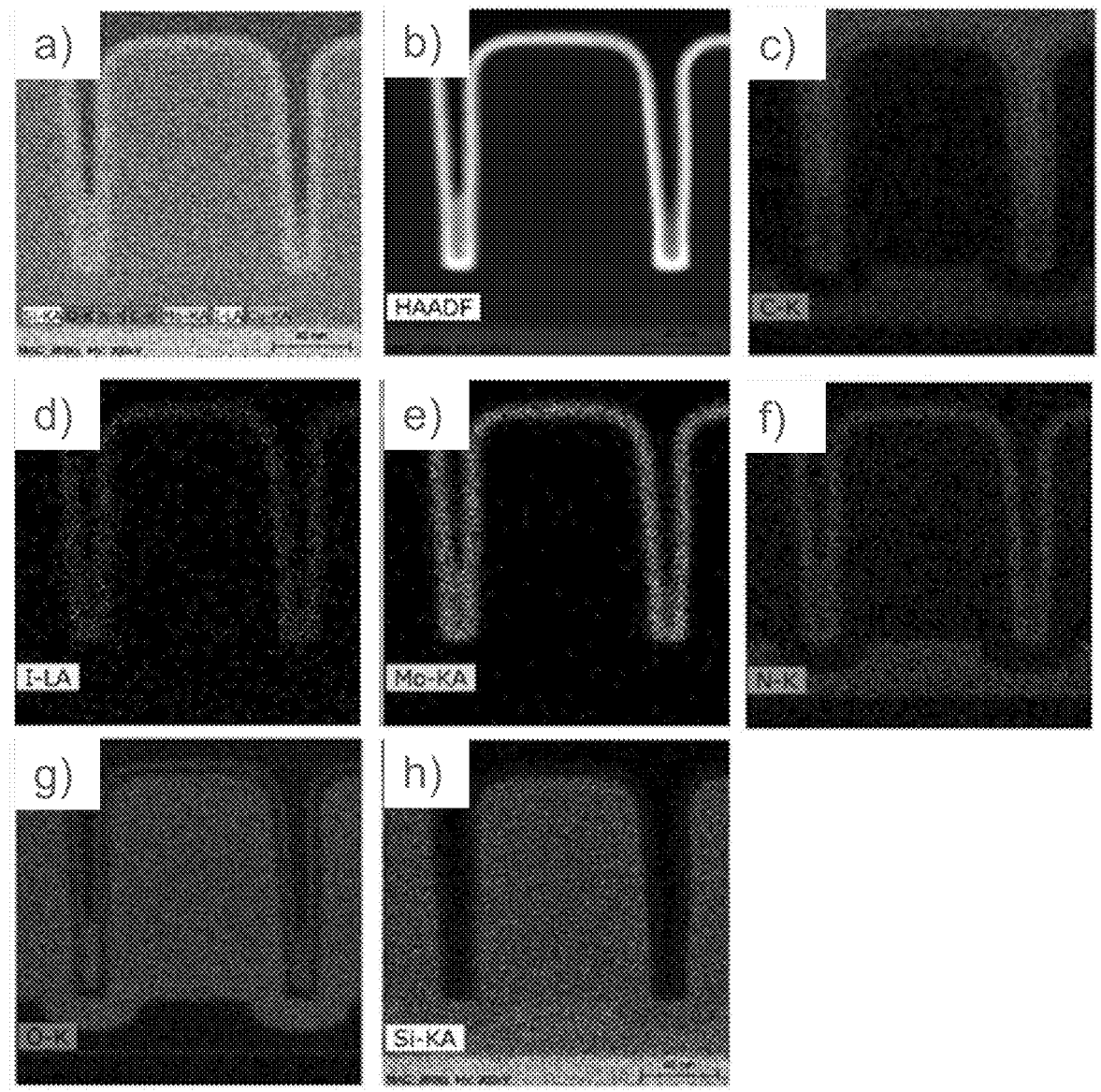

FIG. 9 shows transmission-electron-microscopy electron dispersive spectroscopy (TEM-EDS) images obtained on a sample comprising a gap that was filled by means of a method as described herein. In particular, panel a) shows an overlay of several elemental maps. Panel b) shows an integrated intensity high-angle annular dark-field scanning transmission electron microscopy image. Panel c) shows the spatial distribution of carbon. Panel d) shows the spatial distribution of iodine. Panel d) shows the spatial distribution of Mo. Panel d) shows the spatial distribution of N. Panel e) shows the spatial distribution of O. Pan& f) shows the spatial distribution of Si.

Figure 10:
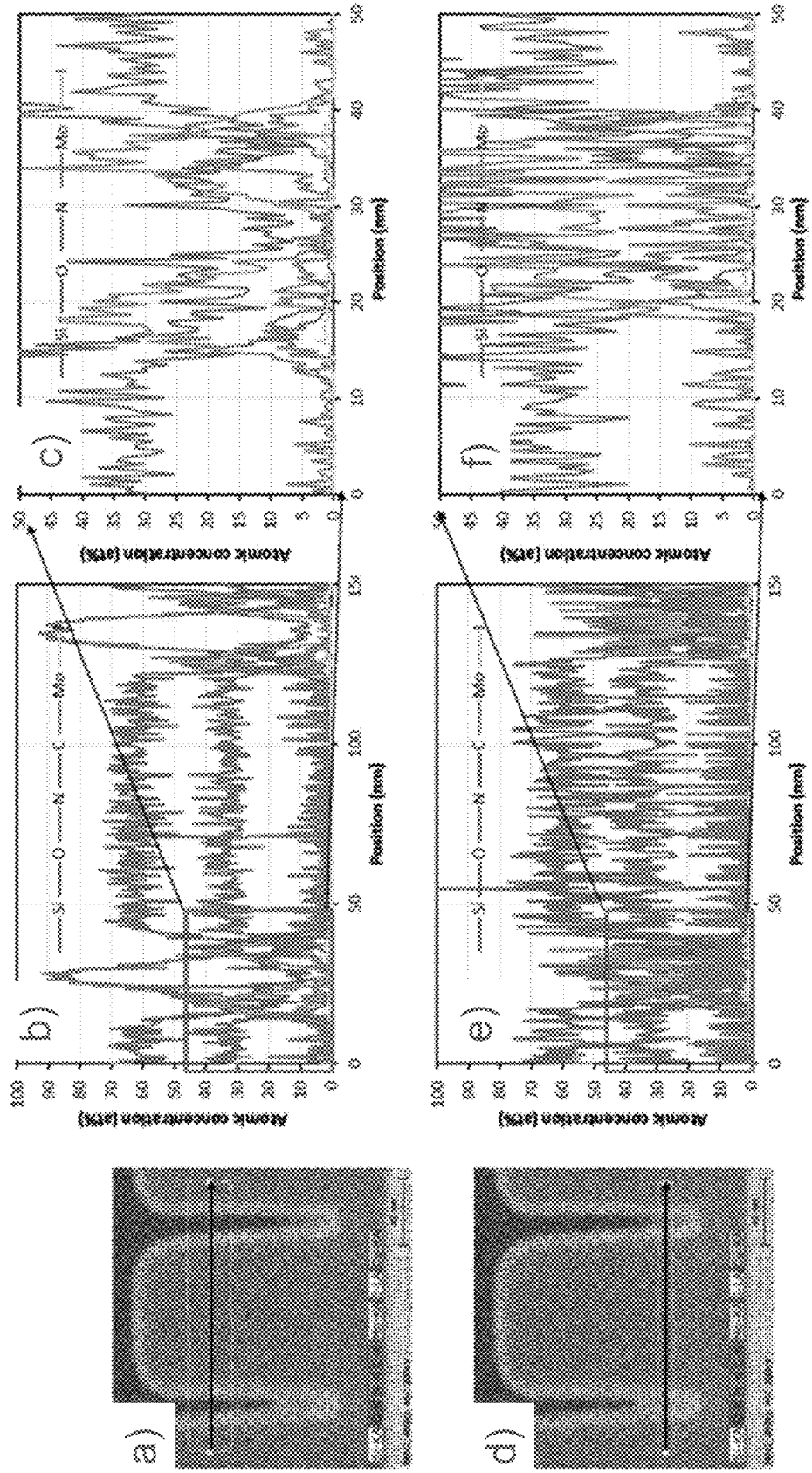

FIG. 10 shows TEM-EDS linescans on a sample comprising a gap that was filled by means of a method as described herein. Panels a), b), and c) show a linescan through an upper part of a gap, that does not contain a gap filling fluid. Panels d), e), and f) show a linescan through a lower part of a gap, that contains a gap filling fluid.

The TEM and EDS measurements show that a metallic molybdenum liner and a molybdenum-containing gap filling fluid can be simultaneously formed by means of a method as described herein. The liner primarily consists of metallic Mo and comprises some carbon, iodine, and nitrogen as impurities. The gap filling fluid fills part of the gap and contains Molybdenum and nitrogen. No carbon or iodine is detected in the gap filling fluid. However, this might be an artifact of the measurement: carbon and iodine might have been removed from the sample during air exposure between deposition and measurement. For example, the gap filling fluid might comprise molybdenum(III) iodide, which is then oxidized in air to form a molybdenum oxide.

Advantageously, the present methods allow filling gaps with metallic molybdenum, or with other molybdenum containing compounds, without formation of any voids or seams. The methods can be applied even for high aspect ratio gaps and/or capillary gaps having a small critical dimension, e.g. in the order of magnitude of 10 to 20 nm or lower.

The invention claimed is:

1. A method of filling a gap, the method comprising
providing a substrate to a reaction chamber, the substrate comprising the gap;
exposing the substrate to a precursor and to a reactant, at least one of the precursor and the reactant comprising a metal or a metalloid, and at least one of the precursor and the reactant comprising a halogen;
thereby allowing the precursor and the reactant to form a gap filling fluid; and,
thereby at least partially filling the gap with a gap filling fluid, the gap filling fluid comprising the metal or the metalloid, and
exposing the substrate to a transformation treatment
wherein the transformation treatment comprises exposing the substrate to ultraviolet radiation.

2. The method according to claim 1 wherein the gap filling fluid comprises the metal or metalloid and the halogen.

3. The method according to claim 1 wherein the precursor and the reactant thermally form the gap filling fluid.

4. The method according to claim 1 wherein the metal or metalloid comprises an element selected from W, Ge, Sb, Te, Nb, Ta, V, Ti, Zr, Rh, Fe, Cr, Mo, Au, Pt, Ag, Ni, Cu, Co, Zn, Al, In, Sn, and Bi.

5. The method according to claim 1 wherein the precursor comprises an alkyl-substituted benzene ring.

6. The method according to claim 1 wherein the reactant comprises a bond selected from a X—X bond, a H—X bond, a C—X bond, a P—X bond, a N—X bond, and a S—X bond; wherein X is a halogen.

7. The method according to claim 6 wherein the reactant comprises an alkyl halide.

8. The method according to claim 1 wherein the precursor comprises bis(ethylbenzene) molybdenum, and wherein the reactant comprises 1,2-diiodoethane.

9. The method according to claim 1 wherein exposing the substrate to a precursor and to a reactant comprises one or more deposition cycles, a deposition cycle comprising a precursor pulse and a reactant pulse;
wherein the precursor pulse comprises exposing the substrate to the precursor; and,
wherein the reactant pulse comprises exposing the substrate to the reactant.

10. The method according to claim 9 wherein a deposition cycle further comprises a nitrogen reactant pulse, and wherein the nitrogen reactant pulse comprises exposing the substrate to the nitrogen reactant.

11. The method according to claim 10 wherein a deposition cycle comprises sequentially executing a plurality of subsequent precursor pulses and nitrogen reactant pulses before or after executing a reactant pulse.

12. The method according to claim 9 wherein, while precursor and the reactant are allowed to form a gap filling fluid, the precursor and the reactant simultaneously react to form a conformal liner in the gap.

13. The method according to claim 1 comprising a plurality of super cycles, a super cycle comprising a step of exposing the substrate to a precursor and to a reactant, and the step of exposing the substrate to a transformation treatment.

14. The method according to claim 1 wherein the transformation treatment comprises exposing the substrate to a plasma.

15. The method according to claim 1 wherein the transformation treatment comprises exposing the substrate to at least one of radicals and ions.

16. The method according to claim 1 wherein the transformation treatment comprises exposing the substrate to a thermal anneal, the thermal anneal comprising at least one of exposing the substrate to an oxidizing agent, a nitridation agent, a reducing agent, and an inert gas.

17. The method according to claim 1 wherein the gap comprises a distal end and a sidewall, and wherein the distal end and the sidewall comprise the same material.

* * * * *